United States Patent
Lee et al.

(10) Patent No.: US 11,895,814 B1
(45) Date of Patent: Feb. 6, 2024

(54) DEVICE FOR SHIELDING ELECTROMAGNETIC WAVE

(71) Applicants: YURA CORPORATION CO., LTD., Gyeonggi-do (KR); Hyundai Motor Company, Seoul (KR); Kia Corporation, Seoul (KR)

(72) Inventors: Sam Gyun Lee, Seoul (KR); Dong Kyu Lim, Bucheon-si (KR); Hong Gyu Jo, Gunpo-si (KR); Kyeong Seop Song, Siheung-si (KR)

(73) Assignees: Hyundai Motor Corporation, Seoul (KR); Kia Corporation, Seoul (KR); Yura Corporation Co., Ltd., Seongnam-Si (KR)

( * ) Notice: Subject to any disclaimer, the term of this patent is extended or adjusted under 35 U.S.C. 154(b) by 0 days.

(21) Appl. No.: 18/321,645

(22) Filed: May 22, 2023

(30) Foreign Application Priority Data

Nov. 9, 2022 (KR) .................. 10-2022-0148584

(51) Int. Cl.
*H05K 9/00* (2006.01)
*B60R 16/02* (2006.01)

(52) U.S. Cl.
CPC ....... *H05K 9/0086* (2013.01); *B60R 16/0215* (2013.01); *H05K 9/0098* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 2002/0157843 A1* | 10/2002 | Fukushima | ...... | H01R 13/65912 174/391 |
| 2004/0057187 A1* | 3/2004 | Kuboshima | ...... | H01R 13/65912 361/118 |
| 2013/0092434 A1* | 4/2013 | Kato | ................... | B60R 16/0215 174/72 A |
| 2013/0118800 A1* | 5/2013 | Toyama | ............... | H05K 9/0007 174/72 A |
| 2013/0192890 A1* | 8/2013 | Adachi | ............... | H02G 3/0406 174/72 A |
| 2013/0199836 A1* | 8/2013 | Adachi | .................. | H05K 9/002 174/384 |
| 2013/0284484 A1* | 10/2013 | Toyama | ............. | B60R 16/0215 174/68.3 |
| 2014/0202763 A1* | 7/2014 | Adachi | .................... | H02H 3/02 174/72 A |
| 2014/0251681 A1* | 9/2014 | Adachi | ................ | H02G 3/0481 174/72 A |
| 2018/0154847 A1* | 6/2018 | Oka | .................... | H01B 7/0063 |
| 2022/0131515 A1* | 4/2022 | Jeong | ..................... | H01P 1/202 |

* cited by examiner

*Primary Examiner* — Hung V Ngo
(74) *Attorney, Agent, or Firm* — Slater Matsil, LLP

(57) ABSTRACT

In an embodiment a device comprising for shielding electromagnetic radiation includes a lower protector mountable on a vehicle body, a conductive shielding structure mountable on the lower protector and conductively connectable to the vehicle body, a conductive shielding net wrapped around and attached to an outer surface of a high voltage wiring, the conductive shielding net attachable and conductively connectable with the conductive shielding structure and an upper protector attachable to the lower protector and configured to press the conductive shielding net to the conductive shielding structure.

20 Claims, 7 Drawing Sheets

DEVICE FOR SHIELDING ELECTROMAGNETIC WAVE

CROSS-REFERENCE TO RELATED APPLICATIONS

This application claims the benefit of Korean Patent Application No. 10-2022-0148584, filed on Nov. 9, 2022, which application is hereby incorporated herein by reference.

TECHNICAL FIELD

The present disclosure relates to a device for shielding electromagnetic radiation and, more particularly, to a device for shielding electromagnetic radiation capable of removing electromagnetic noise emitted from high voltage wiring by being grounded.

BACKGROUND

In general, electrified vehicles such as hybrid vehicles, hydrogen fuel cell vehicles, electric vehicles, and the like are equipped with battery systems for supplying power to driving motors and various electrical components.

As shown in FIG. 1, the battery system includes a high voltage battery 10, a high voltage junction block 30 for distributing power of the high voltage battery 10 to various electronic devices, and a high voltage wiring 20 connected between the high voltage battery 10 and the high voltage junction block 30, and the like.

Accordingly, when power is supplied from the high voltage battery 10 to the high voltage junction block 30 through the high voltage wiring 20, electromagnetic noise may be emitted from the high voltage wiring 20.

Moreover, as high voltage and high efficiency of battery systems and electronic devices are required to improve maintenance and efficiency of the electrified vehicle, and high power and high-speed operation of power semiconductors used in battery systems and electrical devices are required, an amount of emission of electromagnetic noise from battery systems, electronic devices, and the like is increasing.

Such electromagnetic noise may cause abnormal operation of various electrical components mounted in a vehicle, so various electromagnetic shielding structures have been applied to the high voltage battery 10 and the high voltage junction block 30, of the battery system.

However, technology for reducing or shielding electromagnetic noise emitted from the high voltage wiring of the battery system is still insufficient.

For example, electromagnetic noise is emitted from high voltage wiring connected between the high voltage battery and the high voltage junction block, but there is a problem in that technology for reducing or shielding electromagnetic noise emitted from the high voltage wiring is still insufficient.

The foregoing is intended merely to aid in the understanding of the background of the present disclosure and is not intended to mean that the present disclosure falls within the purview of the related art that is already known to those skilled in the art.

SUMMARY

Embodiments provide a device for shielding electromagnetic radiation and capable of removing electromagnetic noise emitted from high voltage wiring by being grounded to a vehicle body through a conductive shielding net and a conductive shielding structure, by covering the high voltage wiring connected between the high voltage battery and the high voltage junction block with a conductive shielding net, mounting a conductive shielding structure in contact to be conductible with the conductive shielding net on a protector, and connecting the conductive shielding structure to the vehicle body so as to be grounded when the protector is mounted on the vehicle body.

Embodiments provide a device for shielding electromagnetic radiation, wherein the device includes a lower protector mounted on a vehicle body; a conductive shielding structure mounted on the lower protector and connected to be conductible to the vehicle body; a conductive shielding net attached to, while wrapping, an outer surface of the high voltage wiring, thereby being brought into close contact to be conductible with the conductive shielding structure; and an upper protector fastened to the lower protector while pressing the conductive shielding net to be brought into close contact with the conductive shielding structure.

The lower protector may include a support plate for supporting the conductive shielding structure; a vertical leg provided to extend downward from each of opposite side parts of the support plate; and a horizontal leg provided to extend outward from the vertical leg and mounted on the vehicle body.

A plurality of binding holes may be provided for binding the high voltage wiring wrapped with the conductive shielding net by a band strap.

The conductive shielding structure may include: a conductive plate seated on the support plate so as to allow the conductive shielding net to be brought into close contact therewith; a conductive vertical plate provided to extend from each of opposite side parts of the conductive plate toward the vertical leg; and a conductive horizontal plate provided to extend from the conductive vertical plate toward the horizontal leg and connected to be conductible to the vehicle body.

In addition, on each of opposite inner surfaces of the vertical leg, a guide protrusion allowing each of opposite side ends of the conductive vertical plate to be inserted and fixed may be provided.

In addition, at an end part of the horizontal leg, a locking hook may be provided so as to allow an end part of the conductive horizontal plate to be inserted and fixed.

In addition, mounting holes for mounting on and connecting, to be conductible, with the vehicle body may be provided by passing through at the horizontal leg and the conductive horizontal plate.

Accordingly, a bolt provided on the vehicle body may be inserted through the mounting holes, and a nut in contact with the conductive horizontal plate may be fastened to the bolt, whereby the conductive horizontal plate may be connected to be conductible with the vehicle body through the nut and the bolt.

In addition, a plurality of embossing protrusions may be provided to protrude at regular intervals on an upper surface part of the conductive plate of the conductive shielding structure to increase a contact area with the conductive shielding net.

A tin (Sn) coating layer having excellent corrosion resistance and conductivity may be provided on a surface of the conductive shielding structure.

In addition, elastic fastening hooks may be provided on opposite side plates of the upper protector and fastening rings which the elastic fastening hooks are inserted into and fastened to may be provided on opposite side plates of the lower protector.

In addition, a pressing plate configured to press the conductive shielding net in order to bring same into close contact to be conductible with the conductive shielding structure may be provided to protrude on a lower surface part of the upper protector.

In addition, a fastening guide groove into which one of opposite side plates of the lower protector is correspondingly inserted may be further provided on a bottom surface of each of opposite side plates of the upper protector.

As described above, the present disclosure provides the following effects.

First, the high voltage wiring connected between the high voltage battery and the high voltage junction block is covered with a conductive shielding net and connected to be able to be grounded to the vehicle body through the conductive shielding structure, whereby electromagnetic noise emitted from high voltage wiring can be easily removed by being grounded to the vehicle body through the conductive shielding net and the conductive shielding structure.

Second, the electromagnetic noise emitted from the high voltage wiring is removed, whereby various electrical components mounted in the vehicle can be freed from the influence of the electromagnetic wave noise, and a phenomenon abnormally operated caused by the electromagnetic noise can be prevented.

Third, embossing protrusions with which the conductive shielding net wrapping the high voltage wiring is in close contact are provided on the conductive shielding structure, whereby it is possible to increase the contact area of the conductive shielding net to the conductive shielding structure. Accordingly, the contact resistance between the conductive shielding net and the conductive shielding structure may be reduced, thereby maximizing the electromagnetic wave shielding performance of removing electromagnetic noise to the ground.

Fourth, a tin coating layer having excellent corrosion resistance and conductivity is provided on the conductive shielding structure, whereby the durability life of the conductive shielding structure can be maximized.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF ILLUSTRATIVE EMBODIMENTS

Hereinafter, exemplary embodiments of the present disclosure will be described in detail with reference to the accompanying drawings.

Figure 2:
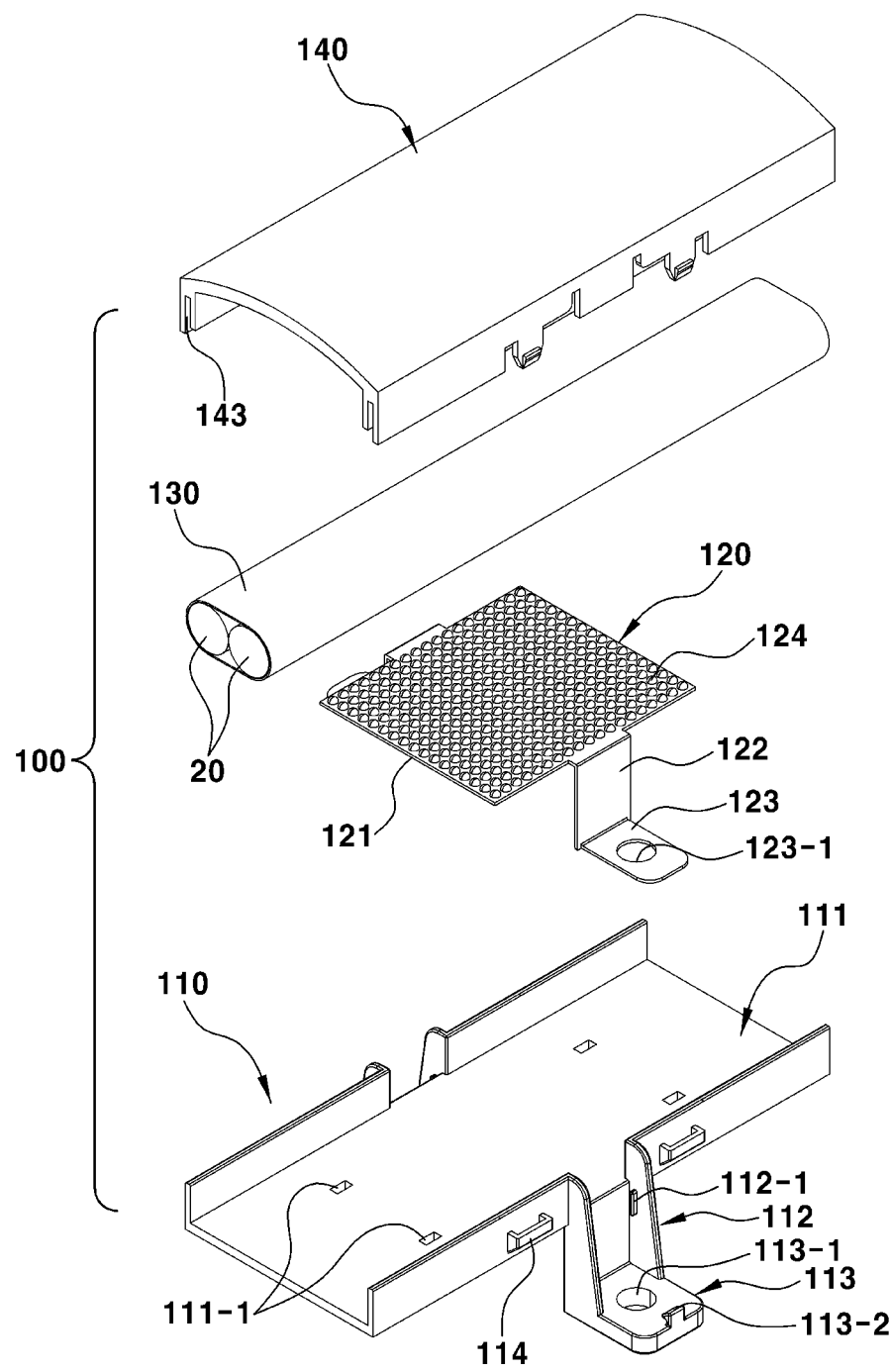
FIG. 2 is an exploded perspective view showing a device for shielding an electromagnetic wave according to embodiments.
Figure 3:
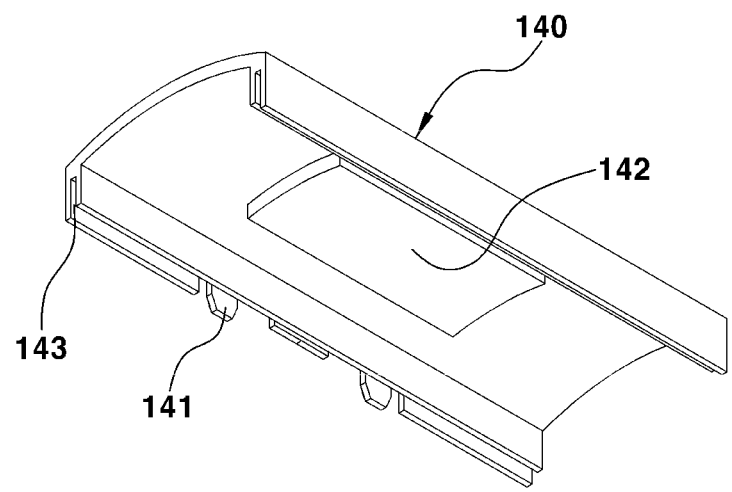
FIG. 3 is a perspective view showing that a pressure plate is provided on an upper protector of the device for shielding electromagnetic radiation according to embodiments.

Attached FIG. 2 is an exploded perspective view showing a device for shielding an electromagnetic wave according to the present disclosure, and attached FIG. 3 is a perspective view showing that a pressure plate is provided on an upper protector of the device for shielding an electromagnetic wave according to the present disclosure.

As shown in FIG. 2, the device for shielding an electromagnetic wave includes a lower protector no mounted on a vehicle body; a conductive shielding structure 120 mounted on the lower protector no and connected to be conductible to the vehicle body; a conductive shielding net 130 attached to, while wrapping, an outer surface of the high voltage wiring 20, thereby being brought into close contact to be conductible with the conductive shielding structure 120; and an upper protector 140 fastened to the lower protector no while pressing the conductive shielding net 130 toward the conductive shielding structure 120.

The lower protector no is a plastic injection structure and includes a support plate 111 having a rectangular plate shape on which the conductive plate 121 of the conductive shielding structure 120 is seated, a vertical leg 112 provided to extend downward from each of opposite side parts of the support plate 111; and a horizontal leg 113 provided to extend outward from the vertical leg 112 and mounted on the vehicle body.

Figure 6:
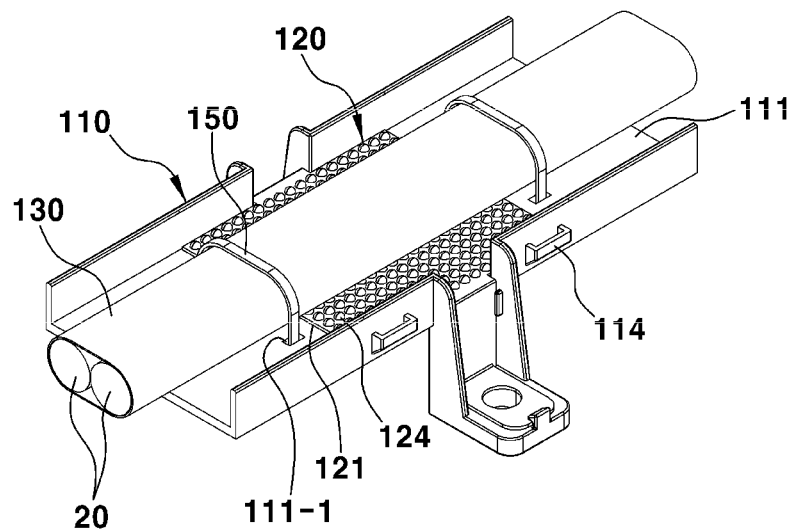
FIG. 6 is a perspective view showing a state in which the high voltage wiring wrapped with the conductive shielding net is put on and bound to a conductive shielding structure of the device for shielding electromagnetic radiation according to embodiments.

As shown in FIG. 6, a plurality of binding holes 111-1 is provided by penetrating through in a predetermined arrangement at the support plate in of the lower protector no for binding the high voltage wiring 20 wrapped with the conductive shielding net 130 by a band strap 150.

In addition, a guide protrusion 112-1 is provided for an inserted fastening direction and fixing of the conductive vertical plate 122 of the conductive shielding structure 120 on each of opposite inner surfaces of the vertical leg 112 of the lower protector no.

In addition, a mounting hole 113-1 for mounting with the vehicle body is provided by penetrating through at the horizontal leg 113 of the lower protector no, and a locking hook 113-2 is provided at an end part of the horizontal leg 113 so as to allow an end part of the conductive horizontal plate 123 of the conductive shielding structure 120 to be inserted and fixed.

In addition, fastening rings 114 are provided on opposite side plates of the lower protector no so as to allow the upper protector 140 to be fastened.

The conductive shielding structure 120 is a conductive metal material and includes a conductive plate 121 of a predetermined area seated on the support plate 111 so as to allow the conductive shielding net 130 to be brought into close contact to be conductible therewith, a conductive vertical plate 122 provided to extend from each of opposite side parts of the conductive plate 121 toward the vertical leg 112, and a conductive horizontal plate 123 provided to extend from the conductive vertical plate 122 toward the horizontal leg 113 and connected to be conductible to the vehicle body, respectively.

Figure 5:
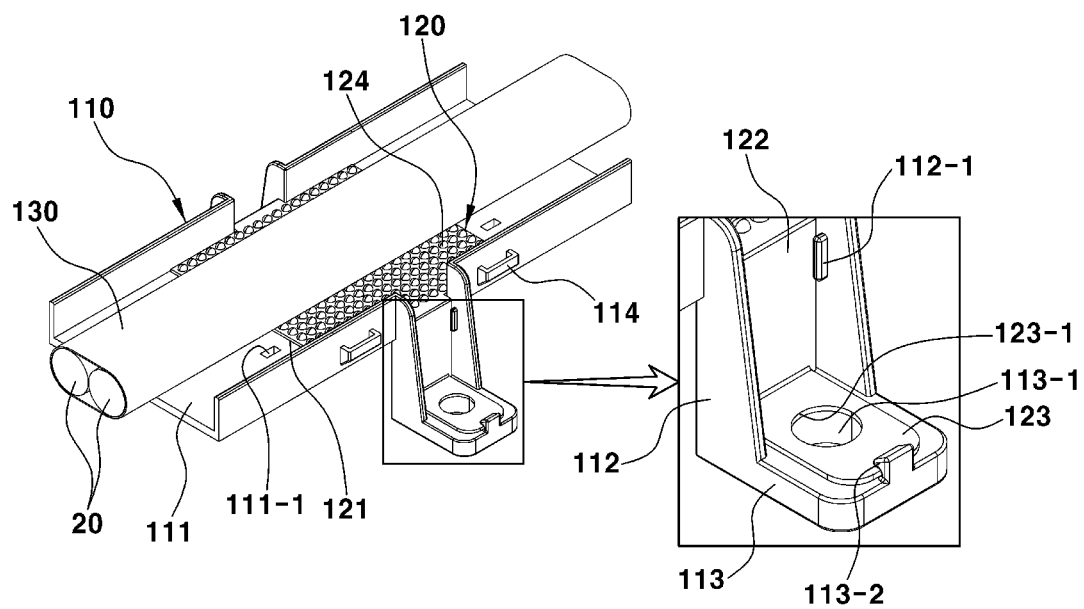
FIG. 5 is a perspective view showing a state in which a conductive shielding structure is assembled to a lower protector of the device for shielding electromagnetic radiation according to embodiments.

As shown in FIG. 5, opposite side ends of the conductive vertical plate 122 of the conductive shielding structure 120 are inserted and fixed between a rear surface of the vertical leg 112 and the guide protrusions 112-1, and the conductive horizontal plate 123 of the conductive shielding structure 120 is brought into close contact with an upper side of the horizontal leg 113, and an end of the conductive horizontal plate 123 may be allowed to be locked by being inserted under and a locking hook 113-2 provided on the horizontal leg 113.

In addition, a mounting hole 123-1 coinciding with the mounting hole 113-1 provided in the horizontal leg 113 is provided by passing through at the conductive horizontal plate 123 of the conductive shielding structure 120.

Figure 10:
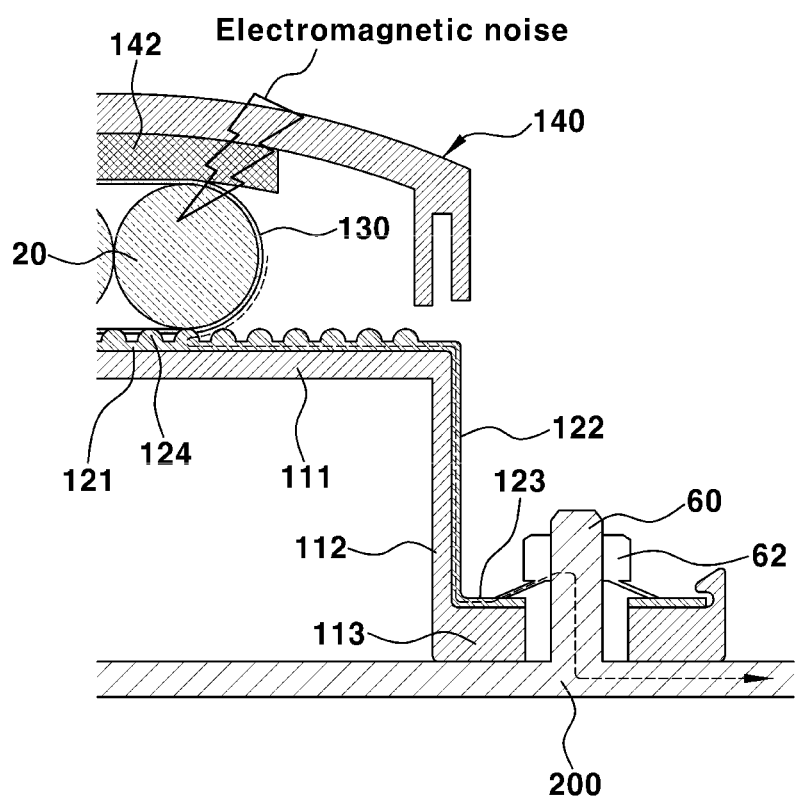
FIG. 10 is a sectional view showing a state in which electromagnetic noise of high voltage wiring is grounded to a vehicle body to be removed by the device for shielding electromagnetic radiation according to embodiments.

Accordingly, as shown in FIG. 10, a stud type bolt 160 provided on the vehicle body 200 is inserted through the mounting hole 123-1 of the conductive horizontal plate 123 and the mounting hole 113-1 of the horizontal leg 113, and a nut 162 configured to tighten the conductive horizontal plate 123 is fastened to the bolt 160, whereby the conductive horizontal plate 123 may be connected to be conductible with the vehicle body 200 through the nut 162 and the bolt 160.

In particular, a plurality of embossing protrusions 124 is provided to protrude at regular intervals on an upper surface of the conductive plate 121 of the conductive shielding structure 120 to increase a contact area with the conductive shielding net 130.

Figure 4:
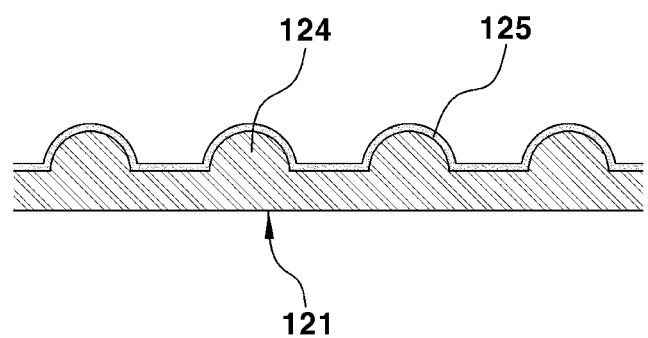
FIG. 4 is an enlarged sectional view of a main part showing that a tin coating layer is provided on a conductive shielding structure of the device for shielding electromagnetic radiation according to embodiments.

As shown in FIG. 4, a tin (Sn) coating layer 125 having excellent corrosion resistance and conductivity may be provided on a surface of the conductive shielding structure 120 including the embossing protrusion 124.

In other words, the conductive shielding structure 120 is made of a conductive metal material (for example, copper and the like), so oxidation and corrosion may occur. Accordingly, the tin (Sn) coating layer 125 which has not only excellent corrosion resistance but also the highest conductivity among materials having excellent corrosion resistance may be coated on the surface of the conductive shielding structure 120 by a conventional plating process.

The conductive shielding net 130 is a conductive metal material made into a form of a film and is attached to, while wrapping, the outer surface of the high voltage wiring 20.

Figure 1:
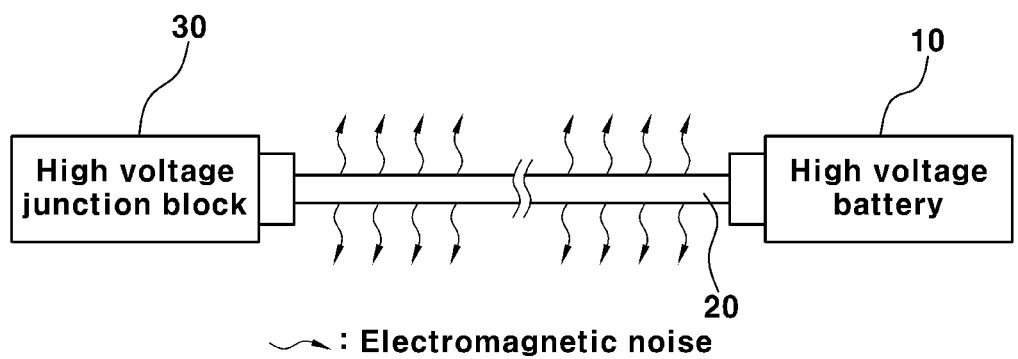
FIG. 1 is a schematic diagram showing that electromagnetic noise is emitted from high voltage wiring connected to a high voltage battery and a high voltage junction block.

More specifically, as shown in FIG. 1, the high voltage wiring 20 may be wiring for power supply connected between the high voltage battery 10 and the high voltage junction block 30, and considering that electromagnetic noise may be emitted from the high voltage wiring 20 when power is supplied, the conductive shielding net 130 is attached to, while wrapping, the outer surface of the high voltage wiring 20 in order to shield electromagnetic noise.

At this time, the conductive shielding net 130 wrapping the high voltage wiring 20 is disposed to be in close contact to be conductible with the conductive plate 121 of the conductive shielding structure 120.

The upper protector 140 is a plastic injection structure like the lower protector no, presses the conductive shielding net 130 wrapping the high voltage wiring 20 so as to be brought into close contact with the conductive plate 121 of the conductive shielding structure 120, and is provided as a cover structure fastened to the lower protector no.

To this end, elastic fastening hooks 141 are provided on the opposite side plates of the upper protector 140 and may be inserted into and fastened to fastening rings 114 provided on opposite side plates of the lower protector no.

Figure 9:
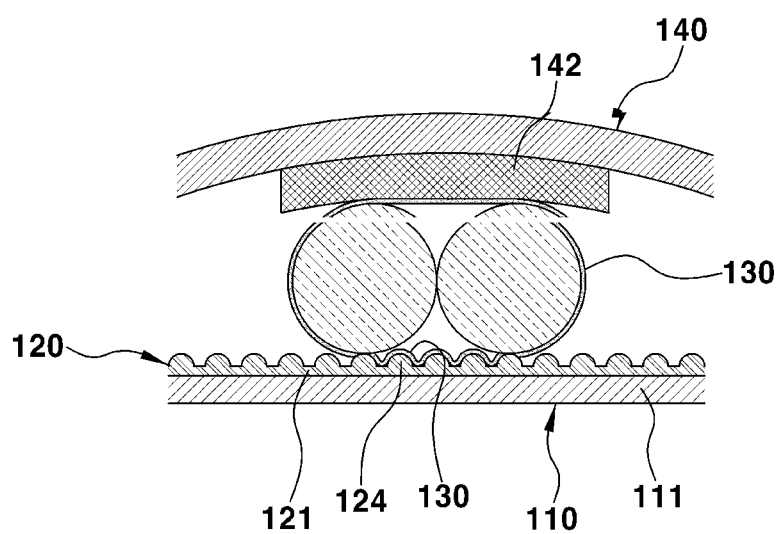
FIG. 9 is a sectional view showing a state in which the conductive shielding net of the electromagnetic wave shielding device is pressed by the pressure plate of the upper protector and brought into close contact with the conductive shielding structure.

In addition, as shown in FIGS. 3 and 9, on a lower surface part of the upper protector 140, a pressing plate 142 having a predetermined thickness for pressing the conductive shielding net 130 wrapping the high voltage wiring 20 to be brought into close contact with the conductive plate 121 of the conductive shielding structure 120 is provided to protrude.

In addition, in order to accurately guide a fastening direction with the lower protector no, a fastening guide groove 143 into which one of opposite side plates of the lower protector no is correspondingly inserted is further provided on a bottom surface of each of opposite side plates of the upper protector 140.

Here, to examine the assembly process for the electromagnetic wave shielding device of the present disclosure having the above configuration is as follows.

First, the outer surface of the high voltage wiring 20 is wrapped with the conductive shielding net 130.

For example, as shown in FIG. 1, the high voltage wiring 20 is connected between the high voltage battery 10 and the high voltage junction block 30, and considering that electromagnetic noise may be emitted from the high voltage wiring 20 when power is supplied, the conductive shielding net 130 is attached to, while wrapping, the outer surface of the high voltage wiring 20 in order to shield electromagnetic noise.

Then, the conductive shielding structure 120 is assembled into the lower protector 110.

To this end, as shown in FIG. 5, opposite ends of the conductive vertical plate 122 of the conductive shielding structure 120 are inserted and fixed between the rear surface of the vertical leg 112 of the lower protector 110 and the guide protrusion 112-1, the conductive horizontal plate 123 of the conductive shielding structure 120 is brought into close contact with the upper side of the horizontal leg 113 of the lower protector 110, and an end of the conductive horizontal plate 123 may be allowed to be locked by being inserted under and a locking hook 113-2 provided on the horizontal leg 113.

Accordingly, the conductive plate 121 of the conductive shielding structure 120 becomes to be in a state brought into close contact with the surface of the support plate in of the lower protector 110.

Subsequently, as shown in FIG. 5, the high voltage wiring 20 wrapped with the conductive shielding net 130 is brought into close contact with and disposed on an upper side of the conductive plate 121 of the conductive shielding structure 120.

Next, the high voltage wiring 20 wrapped with the conductive shielding net 130 disposed on the conductive plate 121 is fixed so as not to be moved due to external force.

To this end, as shown in FIG. 6, the conductive shielding net 130 is tightened with the band strap iso, and at the same time, opposite ends of the band strap 150 are inserted into a binding hole 111-1 provided on the support plate in of the lower protector no to be bound, whereby the high voltage wiring 20 wrapped with the conductive shielding net 130 disposed on the conductive plate 121 may be maintained in a firmly fixed state.

Subsequently, the upper protector 140 is assembled into the lower protector no.

Figure 7:
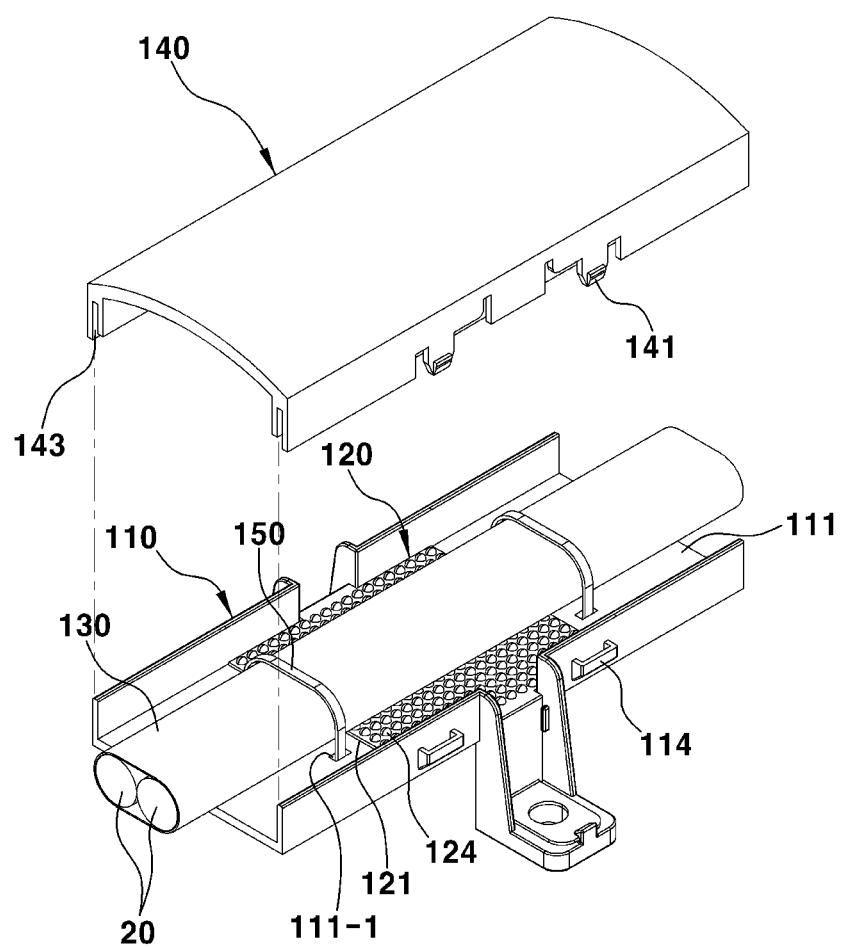
FIG. 7 is a perspective view showing a state in which the upper protector is fastened to the lower protector of the device for shielding electromagnetic radiation according to embodiments.
Figure 8:
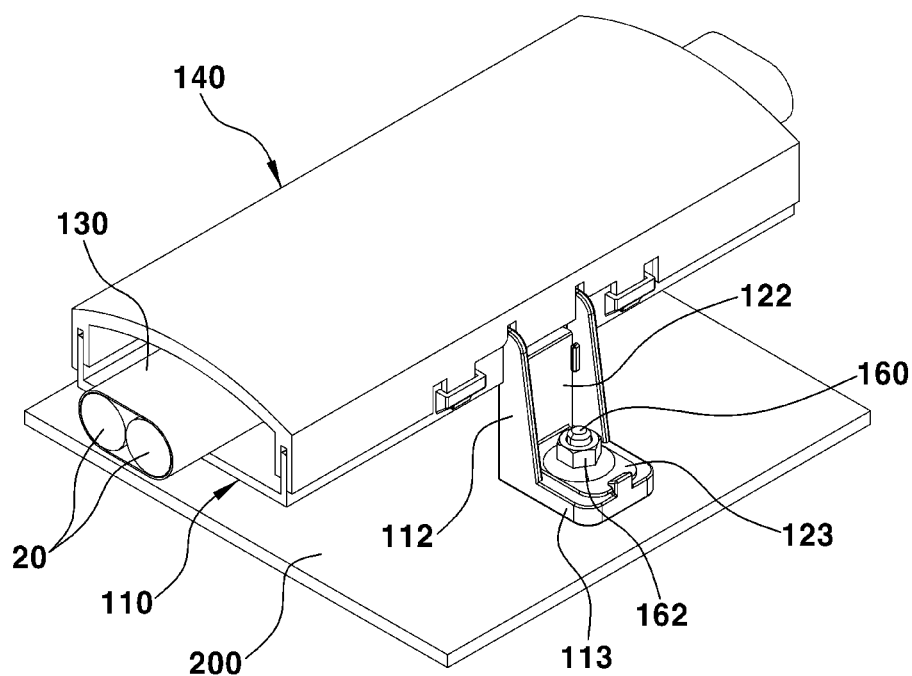
FIG. 8 is a perspective view showing a completely assembled state of the device for shielding electromagnetic radiation according to embodiments.

To this end, as shown in FIGS. 7 and 8, after allowing the opposite side plates of the lower protector no to be correspondingly inserted into the fastening guide grooves 143 provided on the bottom surfaces of the opposite side plates of the upper protector 140, when the upper protector 140 is pressed toward the lower protector no, the elastic fastening hooks 141 provided on the opposite side plates of the upper protector 140 are correspondingly inserted into and fastened to the fastening rings 114 provided on the opposite side plates of the lower protector no, whereby the assembly between the upper protector 140 and the lower protector no is completed.

At this time, as shown in FIGS. 8 and 10, through the mounting hole 123-1 provided in the conductive horizontal plate 123 of the conductive shielding structure 120 and the mounting hole 113-1 provided in the horizontal leg 113 of the lower protector no, the stud-type bolt 160 provided on the vehicle body 200 is inserted, and the nut 162 configured to tighten the conductive horizontal plate 123 is fastened to the bolt 160, whereby the conductive horizontal plate 123 may be connected to be conductible to the vehicle body 200 through the nut 162 and the bolt 160.

As described above, when the assembly between the upper protector 140 and the lower protector no is completed, as shown in FIG. 9, the pressing plate 142 provided on the lower surface of the upper protector 140 presses the conductive shielding net 130 wrapping the high voltage wiring 20 to be brought into close contact with the conductive plate 121 of the conductive shielding structure 120, whereby the conductive shielding net 130 may be brought into close contact with the embossing protrusions 124 of the conductive plate 121 more thoroughly. Accordingly, the contact area of the conductive shielding net 130 with respect to the conductive plate 121 may be increased.

In other words, as the conductive shielding net 130 is brought into close contact with the embossing protrusions 124 of the conductive plate 121 more thoroughly by pressing force of the pressing plate 142, it is possible to increase the contact area of the conductive shielding net 130 with respect to the conductive plate 121 and, at the same time, to reduce the contact resistance of the conductive shielding net 130 with respect to the conductive plate 121. As a result, grounding performance against electromagnetic noise may be improved.

Therefore, even when electromagnetic noise is emitted from the high voltage wiring 20, as indicated by the dotted arrow in FIG. 10, electromagnetic wave noise may be grounded to the vehicle body 200 by passing through in turn the conductive shielding net 130, the conductive plate 121 having the embossing protrusions 124, the conductive vertical plate 122 and the conductive horizontal plate 123, the nut 162, and the bolt 160, thereby being easily removed In addition, besides the electromagnetic wave shielding structure provided in the high voltage battery 10 (a structure that grounds and removes electromagnetic noise) and the electromagnetic wave shielding structure provided in the high voltage junction block 30 (a structure that grounds and removes electromagnetic noise), on the basis of the electromagnetic wave shielding device 100 of the present disclosure that removes electromagnetic noise emitted from the high voltage wiring 20 by grounding, the electromagnetic wave shielding performance of the entire battery system may be improved.

Although the present disclosure has been described in detail as one embodiment, the scope of the present disclosure is not limited to the above-described embodiment, and various modifications and improvements of those skilled in the art using the basic concept of the present disclosure defined in the claims below will also be included in the scope of the present disclosure.

What is claimed is:

1. A device comprising:
    a lower protector mountable on a vehicle body;
    a conductive shielding structure mountable on the lower protector and conductively connectable to the vehicle body;
    a conductive shielding net wrapped around and attached to an outer surface of a high voltage wiring, the conductive shielding net attachable and conductively connectable with the conductive shielding structure; and
    an upper protector attachable to the lower protector and configured to press the conductive shielding net to the conductive shielding structure,
    wherein the device is configured to shield electromagnetic radiation.

2. The device of claim 1, wherein the lower protector comprises:
    a support plate comprising opposite side parts;
    a vertical leg extending downward from each of the opposite side parts; and
    a horizontal leg extending outward from the vertical leg, the horizontal leg mountable to the vehicle body.

3. The device of claim 2, wherein the support plate comprises a plurality of binding holes, wherein the high voltage wiring wrapped with the conductive shielding net is fixed to the support plate by band straps, each band strap going thought one of the plurality of binding holes.

4. The device of claim 2, wherein the conductive shielding structure comprises:
    a conductive plate arrangeable on the support plate so as to allow the conductive shielding net to be brought into close contact with the support plate;
    a conductive vertical plate, each conductive vertical plate arrangeable on a respective vertical leg; and
    a conductive horizontal plate each arrangeable on a respective horizontal leg, the conductive horizontal plate conductively connectable to the vehicle body.

5. The device of claim 4, wherein the conductive plate is arrangeable directly on the support plate and each conductive horizontal plate is directly arrangeable on the respective horizontal leg.

6. The device of claim 4, wherein each vertical leg of the lower protector comprises opposite inner surfaces, each of the opposite side surfaces having a guide protrusion allowing a side end of the respective conductive vertical plate to be inserted.

7. The device of claim 4, wherein an end part of the horizontal leg of the lower protector comprises a locking hook configured to allow an end part of the conductive horizontal plate to be inserted and to be fixed.

8. The device of claim 4, wherein each of the horizontal leg and the conductive horizontal plate comprises a mounting hole for mounting the device to the vehicle body.

9. The device of claim 8, further comprising:
a bolt insertable through the mounting holes; and
a nut in contact with the conductive horizontal plate and fastened to the bolt,
wherein the conductive horizontal plate is conductively connectable with the vehicle body via the nut and the bolt.

10. The device of claim 4, wherein the conductive plate comprises a plurality of embossed protrusions protruding at regular intervals on an upper surface part in order to increase a contact area between the conductive shielding net and the conductive shielding structure.

11. The device of claim 2, wherein the upper protector comprises elastic fastening hooks on opposite side plates, wherein the opposite side parts of the support plate comprise fastening rings, and wherein the elastic fastening hooks are insertable into the fastening rings.

12. The device of claim 1, wherein a surface of the conductive shielding structure comprises a tin (Sn) coating layer.

13. The device of claim 1, wherein a pressing plate is provided at a lower surface part of the upper protector, the pressing plate being configured to press the conductive shielding net on the conductive shielding structure.

14. The device of claim 1, wherein a bottom surface of each opposite side plate of the upper protector comprises a fastening guide groove configured to receive an opposite side plate of the lower protector.

15. A device comprising:
a lower protector mountable to a vehicle body;
a conductive shielding structure mounted on the lower protector so that the conductive shielding is conductively connectable to the vehicle body;
a conductive shielding net wrapped around and attached to an outer surface of a high voltage wiring, the high voltage wiring configured to emit electromagnetic radiation; and
an upper protector fastened to the lower protector and pressing the conductive shielding net to the conductive shielding structure,
wherein the device is configured to shield other devices from the electromagnetic radiation.

16. The device of claim 15, wherein the lower protector comprises:
a support plate comprising opposite side parts, each opposite side part extending upward, wherein the support plate has a length and a width;
vertical legs, each vertical leg extending downward from an opposite side part; and
a horizontal leg extending outward from a bottom of the vertical leg in a width direction, the horizontal leg mountable to the vehicle body.

17. The device of claim 16, wherein the conductive shielding structure comprises:
a conductive plate arranged on and in contact with the support plate;
a conductive vertical plate, each conductive vertical plate arranged on a respective vertical leg; and
a conductive horizontal plate, each arranged on a respective horizontal leg, wherein the conductive horizontal plate is conductively connectable to the vehicle body.

18. The device of claim 17, wherein each vertical leg of the lower protector comprises opposite inner surfaces, each of the opposite side surfaces having a guide protrusion allowing a side end of a respective conductive vertical plate to be inserted.

19. The device of claim 17, wherein an end part of the horizontal leg of the lower protector comprises a locking hook configured to allow an end part of the conductive horizontal plate to be inserted and to be fixed.

20. The device of claim 17, wherein each of the horizontal leg and the conductive horizontal plate comprises a mounting hole for mounting the device to the vehicle body.

* * * * *